United States Patent
Leobandung

(10) Patent No.: US 9,337,148 B2
(45) Date of Patent: May 10, 2016

(54) CHIP WITH PROGRAMMABLE SHELF LIFE

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/933,044

(22) Filed: Nov. 5, 2015

(65) Prior Publication Data

US 2016/0064331 A1    Mar. 3, 2016

Related U.S. Application Data

(62) Division of application No. 14/270,763, filed on May 6, 2014, now Pat. No. 9,245,846.

(51) Int. Cl.
| | |
|---|---|
| *H01L 23/00* | (2006.01) |
| *H01L 23/532* | (2006.01) |
| *H01L 23/528* | (2006.01) |
| *H01L 23/58* | (2006.01) |

(52) U.S. Cl.
CPC ........ *H01L 23/53238* (2013.01); *H01L 23/528* (2013.01); *H01L 23/5329* (2013.01); *H01L 23/576* (2013.01); *H01L 23/58* (2013.01)

(58) Field of Classification Search
CPC ................. H01L 23/5222; H01L 23/5329
See application file for complete search history.

(56) References Cited

U.S. PATENT DOCUMENTS

| | | | |
|---|---|---|---|
| 4,900,695 A | 2/1990 | Takahashi et al. | |
| 5,986,343 A | 11/1999 | Chittipeddi et al. | |
| 6,016,000 A | 1/2000 | Moslehi | |
| 6,124,198 A * | 9/2000 | Moslehi | 438/622 |
| 6,197,688 B1 | 3/2001 | Simpson | |
| 6,218,197 B1 | 4/2001 | Kasai | |

(Continued)

FOREIGN PATENT DOCUMENTS

| | | |
|---|---|---|
| DE | 19512266 A1 | 3/1996 |
| DE | 19512266 C2 | 11/1998 |

OTHER PUBLICATIONS

Stolt et al., "Formation of Cu3Si and its Catalytic Effect on Silicon Oxidation at Room Temperature", J. Vac. Sci. Technol., A 9 (3), May/Jun. 1991, pp. 1501-1505.

(Continued)

*Primary Examiner* — Mohammad Islam
*Assistant Examiner* — Ankush Singal
(74) *Attorney, Agent, or Firm* — L. Jeffrey Kelly; Louis J. Percello

(57) ABSTRACT

A structure includes a first interconnect structure and a second interconnect structure each located within an interlevel dielectric (ILD), a first top metal layer and a second top metal layer disposed on and in direct electrical connection with the first interconnect, a third top metal layer and a fourth top metal layer disposed on and in direct electrical connection with the second interconnect, a silicon dioxide layer above the first, second, third and fourth top metal layers, the silicon layer is in direct contact with the first and fourth top metal layers, and a barrier layer separating the silicon dioxide layer from each of the second and third top metal layers, a high resistance connection exist between the third top metal layer and the fourth top metal layer due to the presence of the silicon dioxide layer.

18 Claims, 5 Drawing Sheets

(56) References Cited

U.S. PATENT DOCUMENTS

| | | | |
|---|---|---|---|
| 6,359,328 B1 | 3/2002 | Dubin | |
| 6,455,943 B1* | 9/2002 | Sheu et al. | 257/786 |
| 6,458,547 B1 | 10/2002 | Bryan et al. | |
| 6,577,017 B1 | 6/2003 | Wong | |
| 6,709,918 B1 | 3/2004 | Ng et al. | |
| 7,111,213 B1 | 9/2006 | Dastidar et al. | |
| 7,180,195 B2 | 2/2007 | Bohr et al. | |
| 7,281,231 B2 | 10/2007 | Kan et al. | |
| 7,304,324 B2 | 12/2007 | Kuroda et al. | |
| 7,312,530 B2* | 12/2007 | Hashimoto et al. | 257/758 |
| 7,397,125 B2* | 7/2008 | Oda | 257/758 |
| 7,480,882 B1 | 1/2009 | Song et al. | |
| 7,592,710 B2* | 9/2009 | Hsia et al. | 257/786 |
| 7,622,364 B2 | 11/2009 | Adkisson et al. | |
| 7,743,963 B1 | 6/2010 | Chung | |
| 7,955,973 B2* | 6/2011 | Zecri | 438/666 |
| 7,969,006 B2 | 6/2011 | Lin et al. | |
| 8,030,733 B1 | 10/2011 | Naem | |
| 8,084,279 B2 | 12/2011 | Kasaoka et al. | |
| 8,084,858 B2* | 12/2011 | Daubenspeck et al. | 257/734 |
| 8,183,698 B2* | 5/2012 | Antol et al. | 257/780 |
| 8,195,872 B2 | 6/2012 | Ito | |
| 8,581,423 B2* | 11/2013 | Chen et al. | 257/786 |
| 8,792,034 B2* | 7/2014 | Takahashi | 348/305 |
| 2001/0010408 A1 | 8/2001 | Ker et al. | |
| 2001/0042897 A1 | 11/2001 | Yeh et al. | |
| 2001/0051426 A1* | 12/2001 | Pozder et al. | 438/666 |
| 2002/0090649 A1* | 7/2002 | Chan et al. | 435/7.1 |
| 2002/0192919 A1* | 12/2002 | Bothra | 438/381 |
| 2003/0047794 A1* | 3/2003 | Watanabe | 257/503 |
| 2004/0150112 A1* | 8/2004 | Oda | 257/758 |
| 2005/0023692 A1 | 2/2005 | Matsunaga et al. | |
| 2006/0065969 A1* | 3/2006 | Antol et al. | 257/700 |
| 2006/0099785 A1 | 5/2006 | Fuller et al. | |
| 2006/0180946 A1 | 8/2006 | Chen | |
| 2006/0189125 A1* | 8/2006 | Kata et al. | 438/622 |
| 2006/0278981 A1 | 12/2006 | Trezza et al. | |
| 2006/0281363 A1 | 12/2006 | Trezza | |
| 2007/0026574 A1 | 2/2007 | Beatson et al. | |
| 2007/0085078 A1 | 4/2007 | Kuroda et al. | |
| 2007/0087130 A1 | 4/2007 | Arai | |
| 2007/0226518 A1 | 9/2007 | Yasaki et al. | |
| 2008/0028477 A1 | 1/2008 | Lehmann et al. | |
| 2008/0290516 A1 | 11/2008 | Oda | |
| 2010/0323217 A1 | 12/2010 | Tachibana et al. | |
| 2011/0298070 A1 | 12/2011 | Fukui et al. | |
| 2012/0138346 A1* | 6/2012 | Uematsu et al. | 174/255 |
| 2012/0161318 A1 | 6/2012 | Min | |
| 2012/0220102 A1* | 8/2012 | Or-Bach et al. | 438/458 |
| 2013/0227538 A1 | 8/2013 | Maruyama | |
| 2013/0253868 A1 | 9/2013 | Bansal et al. | |
| 2013/0254731 A1 | 9/2013 | Bansal et al. | |
| 2013/0323930 A1 | 12/2013 | Chattopadhyay et al. | |

OTHER PUBLICATIONS

Hinode et al., "Abnormal Room-Temperature Oxidation of Silicon in the Presence of Copper", J. Vac. Sci. Technol., A 20 (5), Sep./Oct. 2002, pp. 1653-1658.

Pending U.S. Appl. No. 14/270,763, filed May 6, 2014, entitled: "Chip With Programmable Shelf Life", 20 pages.

* cited by examiner ns, well-known structures or processing steps have not been described in detail in order to avoid obscuring the invention.

CHIP WITH PROGRAMMABLE SHELF LIFE

BACKGROUND

The present invention generally relates to integrated circuits (IC), and more particularly to fabricating IC chips having a programmable shelf life.

New IC technologies may include individual IC chips (i.e., "dies") arranged into a three dimensional integrated circuit, also known as a three dimensional semiconductor package (3D package). One type of 3D package may include two or more layers of active electronic components stacked vertically and electrically joined with some combination of through substrate vias and solder bumps. Current IC chips may never expire, they may exhibit a long lifespan and may even last forever if not powered up.

To continue the miniaturization trend in current IC technology, copper (Cu) metallization may be extensively used due to its low resistivity and high migration resistance. Owing to the rapid diffusion of copper into silicon (Si) and silicon dioxide ($SiO_2$), copper structures may be covered with barrier metals and barrier insulators to prevent degradation of the IC. In the presence of oxygen and at relatively low temperatures, copper may act as a catalyst during the oxidation of silicon to form silicon dioxide.

SUMMARY

The ability to manufacture integrated circuit (IC) chips having a programmable shelf life that may allow the IC chips to regain operability after expiring may prevent, among other things, misuse of sensitive data stored in the IC chips and/or stop unauthorized use of the IC chips after a certain period of time.

According to an embodiment of the present disclosure, a structure may include a first interconnect structure and a second interconnect structure each located within an interlevel dielectric (ILD), a first top metal layer and a second top metal layer disposed on and in direct electrical connection with the first interconnect, a third top metal layer and a fourth top metal layer disposed on and in direct electrical connection with the second interconnect, a silicon dioxide layer above the first, second, third and fourth top metal layers, the silicon layer is in direct contact with the first and fourth top metal layers, and a barrier layer separating the silicon dioxide layer from each of the second and third top metal layers, a high resistance connection exist between the third top metal layer and the fourth top metal layer due to the presence of the silicon dioxide layer.

According to another embodiment of the present disclosure, a structure may include a plurality of top metal layers in an interlevel dielectric (ILD), the plurality of top metal layers are electrically connected to one or more interconnect structures of an IC chip, a barrier layer directly above two adjacent top metal layers, the two adjacent top metal layers being located between two outer top metal layers, and an oxidized silicon layer above the two adjacent top metal layers and the two outer top metal layers, the oxidized silicon layer being directly on top of the outer top metal layers, the oxidized silicon layer is separated from the two adjacent top metal layers by the barrier layer, the oxidized silicon layer, the two adjacent top metal layers and the barrier layer includes a sensing circuit, the oxidized silicon layer damages the sensing circuit and makes the IC chip inoperable.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
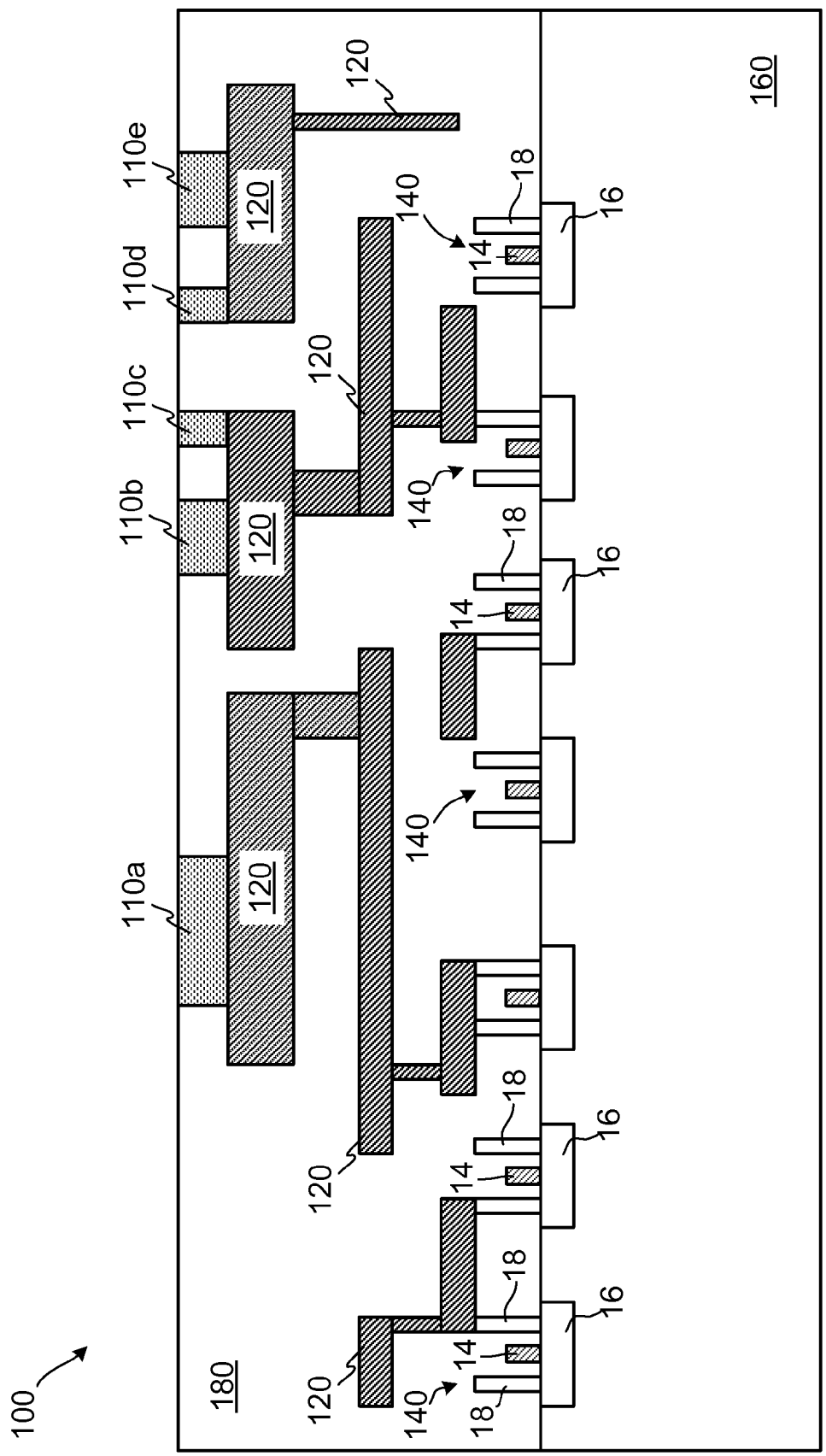
FIG. 1 is a cross-sectional view of an integrated circuit (IC) chip, according to an embodiment of the present disclosure.

Detailed embodiments of the claimed structures and methods are disclosed herein; however, it may be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention.

It will be understood that when an element as a layer, region, or substrate is referred to as being "on" or "over" another element, it may be directly on the other element or intervening elements may also be present. In contrast, when an element is referred to as being "directly on" or "directly over" another element, there are no intervening elements present. It will also be understood that when an element is referred to as being "beneath," "below," or "under" another element, it may be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

An integrated circuit (IC) chip may include a plurality of interconnected electronic circuits formed on a semiconductor substrate. IC chips may have a long lifespan, in some cases they may never expire. The extended life of current electronic devices, including IC chips, may put at risk sensitive data stored in such devices if unauthorized access occurs. Limiting the life of an IC chip may find applications in areas such as weapon systems, chip security, and/or cyber security where sensitive information may need to be destroyed after a certain period of time in order to avoid security threats that may arise from inappropriate use of the stored information. Accordingly, fabricating IC chips with a programmable shelf life that may allow the IC chip to stop working after a determined period of time but may be reprogrammed to regain operability may, among other potential benefits, enhance data security in many industry and government sectors.

Referring now to FIG. 1, a cross-sectional view of an integrated circuit (IC) chip 100 after completion of a semiconductor metallization step is shown, according to an embodiment of the present disclosure. At this stage of the fabrication process, the IC chip 100 may include numerous electronic devices 140 formed on a substrate 160. In an exemplary embodiment, the electronic devices 140 may include field effect transistor (FET) devices such as transistors, capacitors, and the like. The electronic devices 140 may include gate structures 14, source-drain regions 16 and a plurality of metal contacts 18 (hereinafter "contacts"). Typically, the gate structures 14 may be energized to create an electric field in an underlying channel region of the substrate 160, by which charge carriers may be allowed to travel through the channel region between the source-drain regions 16 of the substrate 160. The contacts 18 may be subsequently formed to electrically connect the electronic devices 140 to subsequently formed metallization layers. The contacts 18 may typically include tungsten (W).

The substrate 160 may be, for example, a semiconductor-on-insulator (SOI) substrate, where a buried insulator layer (not shown) separates a base substrate (not shown) from a top semiconductor layer (not shown). The components of the IC chip 100, including the electronic devices 140, may then be formed in or adjacent to the top semiconductor layer. In other embodiments, the substrate 160 may be a bulk substrate which may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide.

The IC chip 100 may also include various metal interconnect structures 120 (hereinafter "interconnect structures") that may be formed in an interlevel dielectric (ILD) 180. The interconnect structures 120 may typically be formed by depositing a dielectric layer (such as the ILD 180) above the electronic devices 140, etching a recess (not shown) in the dielectric layer and filling the recess with a metal. The electronic devices 140 may be coupled to the interconnect structures 120 through the contacts 18 to conduct current though the different circuit layers of the IC chip 100. In some embodiments, multiple layers of the ILD 180 may be formed above the electronic devices 140. The interconnect structures 120 may include, for example, wires, trenches, or vias. In the depicted embodiment, the interconnect structures 120 may include a copper-rich material. It should be noted that the process of forming the electronic devices 140 and the interconnect structures 120 is typical and well known to those skilled in the art.

The IC chip 100 may further include top metal layers 110a-110e formed in the ILD 180. The top metal layers 110a-110e may be disposed on and electrically connected to the interconnect structures 120 providing a pad to be used during a subsequent chip bonding process such as, for example, a Controlled Collapse Chip Connection (C4) process which may be conducted to couple or join the IC chip 100 to a circuit board (not shown). The top metal layers 110a-110e may include a copper-rich material that may be deposited by any suitable deposition technique, such as, for example, by chemical vapor deposition (CVD). The top metal layers 110a-110e may have a thickness ranging from approximately 0.5 μm to approximately 2 μm.

The top metal layers 110b-110e may alternatively be referred to as "terminals". More specifically, the top metal layers 110b, 110e may be referred to as "oxidizing terminals", and the top metal layers 110c, 110d may be referred to as "sensing terminals".

Figure 2:
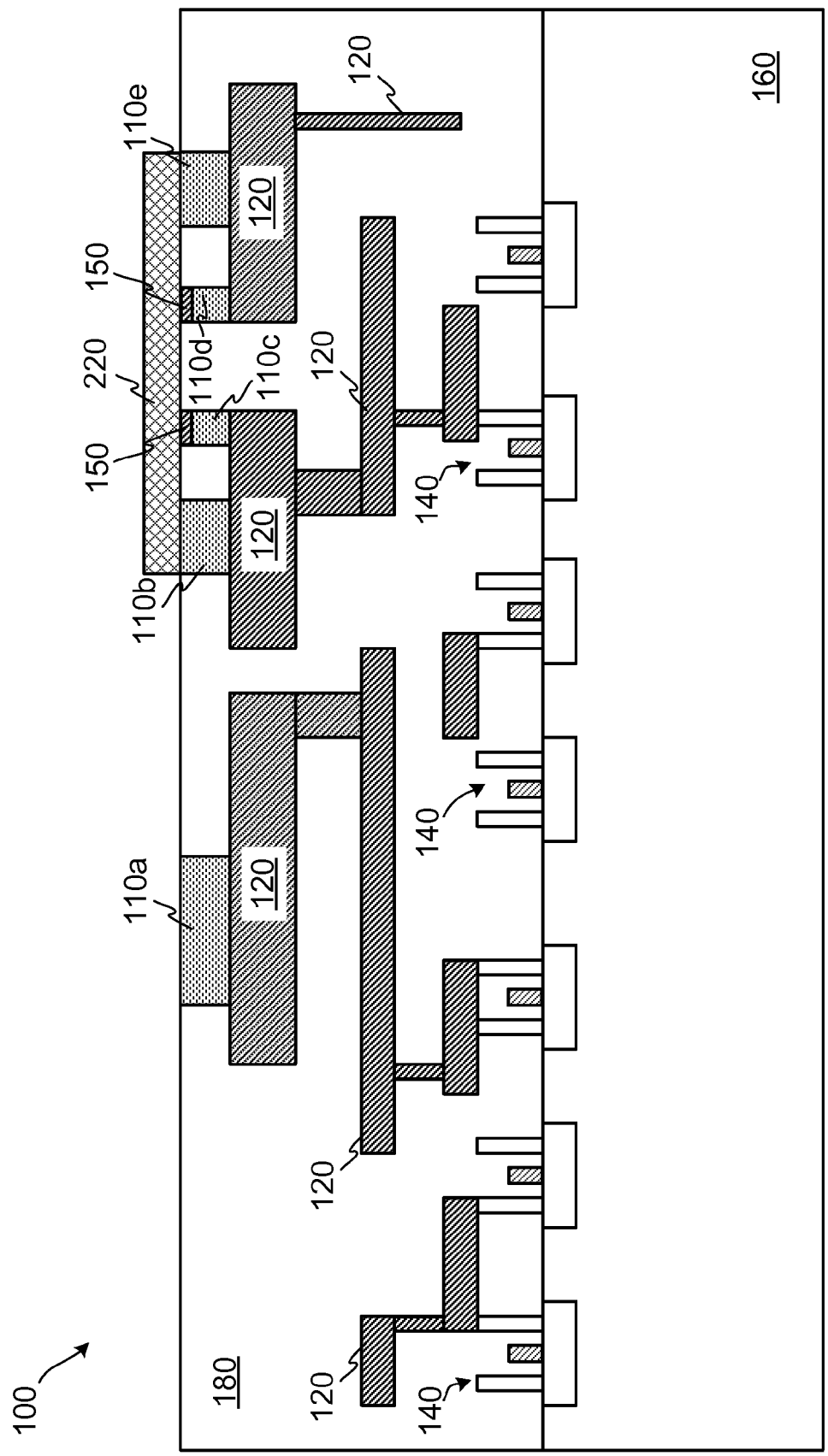
FIG. 2 is a cross-sectional view of the IC chip depicting forming a barrier layer and a silicon layer, according to an embodiment of the present disclosure.

Referring now to FIG. 2, a barrier layer 150 may be formed above the sensing terminals 110c, 110d. The barrier layer 150 may prevent the copper of the sensing terminals 110c, 110d from coming into direct contact with a subsequently formed silicon layer. By doing so, electrical contact may be maintained between the sensing terminals 110c, 110d and the silicon layer 220 (FIG. 3) forming a sensing circuit in the IC chip 100. This sensing circuit may behave similarly to a fuse, as will be described in detail below.

In one embodiment, the barrier layer 150 may include titanium nitride (TiN). In another embodiment, the barrier layer 150 may include tantalum nitride (TaN). The barrier layer 150 may be formed by any suitable deposition technique known in the art, such as, for example, CVD. The barrier layer 150 may have a thickness ranging from approximately 10 nm to approximately 100 nm.

With continued reference to FIG. 2, a silicon layer 220 may be formed and patterned above the ILD 180. More specifically, the silicon layer 220 may be in direct contact with the oxidizing terminals 110b, 110e and above the sensing terminals 110c, 110d such that the oxidizing terminals 110b, 110e may cause the silicon layer 220 to oxidize. In one exemplary embodiment, the silicon layer 220 may be formed by CVD of an amorphous silicon (a-Si) material. The silicon layer 220 may have a thickness ranging from approximately 100 nm to approximately 1 μm and a length ranging from approximately 100 μm to approximately 10,000 μm.

By intentionally forming the silicon layer 220 in direct contact with the oxidizing terminals 110b, 110e, properties of the chemical reaction between copper and silicon in the presence of oxygen may be used to limit the life of the IC chip 100. Under ambient (room) conditions of pressure and temperature, copper atoms from the oxidizing terminals 110b,110e may diffuse to the silicon layer 220 having a catalytic effect on the oxidation of the silicon layer 220 which may lead to the formation of a silicon dioxide compound (not shown). Owing to these properties, as the IC chip is exposed to an oxygen-containing environment and time progresses, the chemical reaction between silicon, oxygen, and copper may take place until the silicon layer 220 may be consumed and replaced by a silicon dioxide layer. This may result in a substantially high electrical resistance connection between the sensing terminals 110c, 110d, since the silicon dioxide layer formed as a result of the oxidation of the silicon layer 220 may act as an insulator between the sensing terminals 110c, 110d. The high electrical resistance between the sensing terminals 110c, 110d may limit current flow between these terminals of the sensing circuit creating an electrical open or open circuit within the IC chip 100 which may cause the IC chip 100 to be inoperable. The electrical configuration of the IC chip 100, the location of the silicon layer 220 and the properties of the oxidation reaction between silicon and copper in the presence of oxygen may help imposing a shelf life to the IC chip 100 as will be described in detail below.

Figure 3:
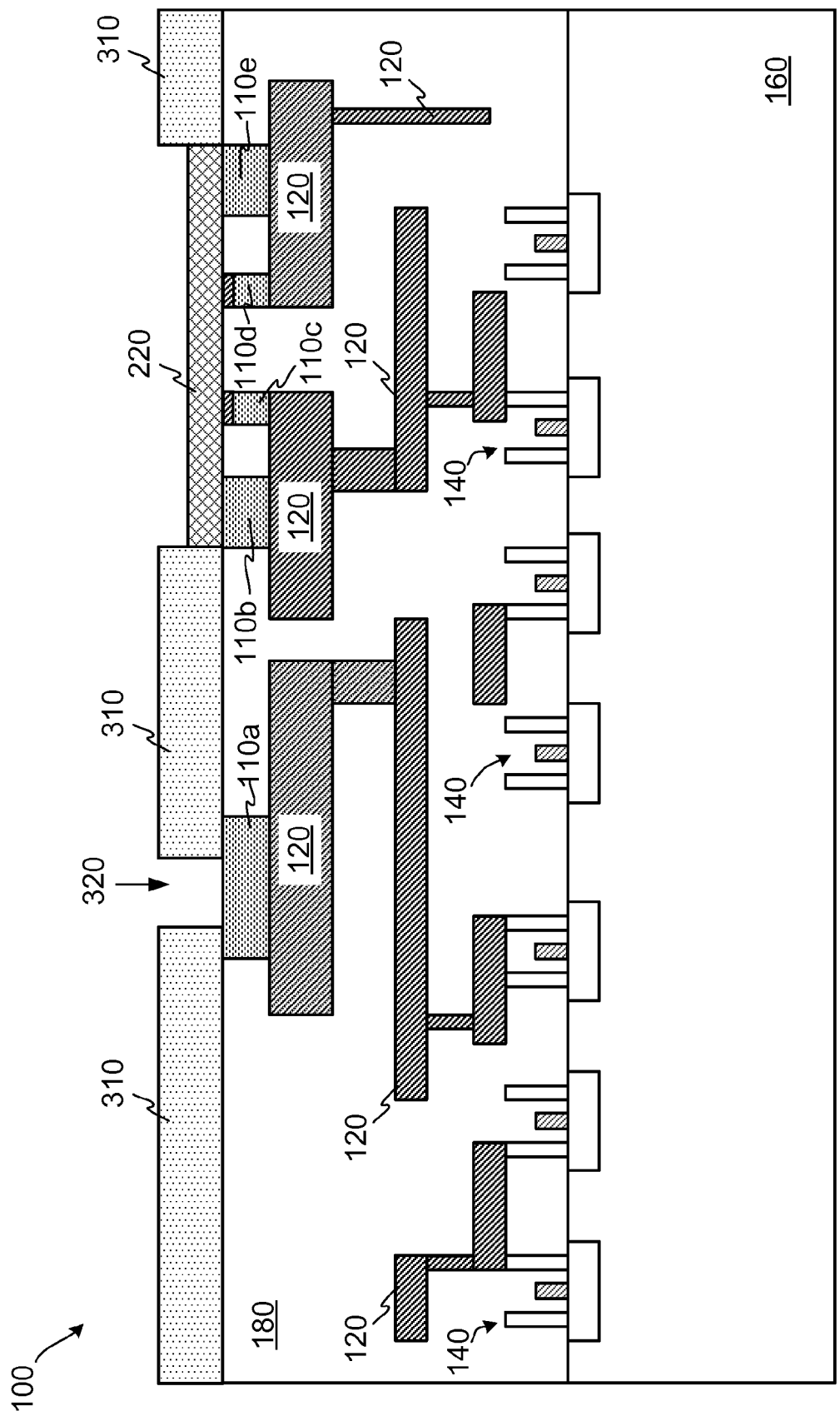
FIG. 3 is a cross-sectional view of the IC chip depicting forming a protective layer, according to an embodiment of the present disclosure.

Referring now to FIG. 3, a protective layer 310 may be formed above the ILD 180. The protective layer 310 may function as a passivation or stress buffer layer during a subsequent C4 chip packaging process. In an exemplary embodiment, the protective layer 180 may include a polyamide layer. The protective layer 180 may be formed by means of any suitable deposition technique known in the art, such as, for example, CVD. The protective layer 310 may have a thickness ranging from approximately 20 nm to approximately 500 nm. The protective layer 310 may subsequently be patterned to form an opening 320 that may expose the top metal layer 110a and uncover the silicon layer 220. It should be understood that the steps involved in patterning the protective layer 310 are typical and well-known to those skilled in the art.

Figure 4:
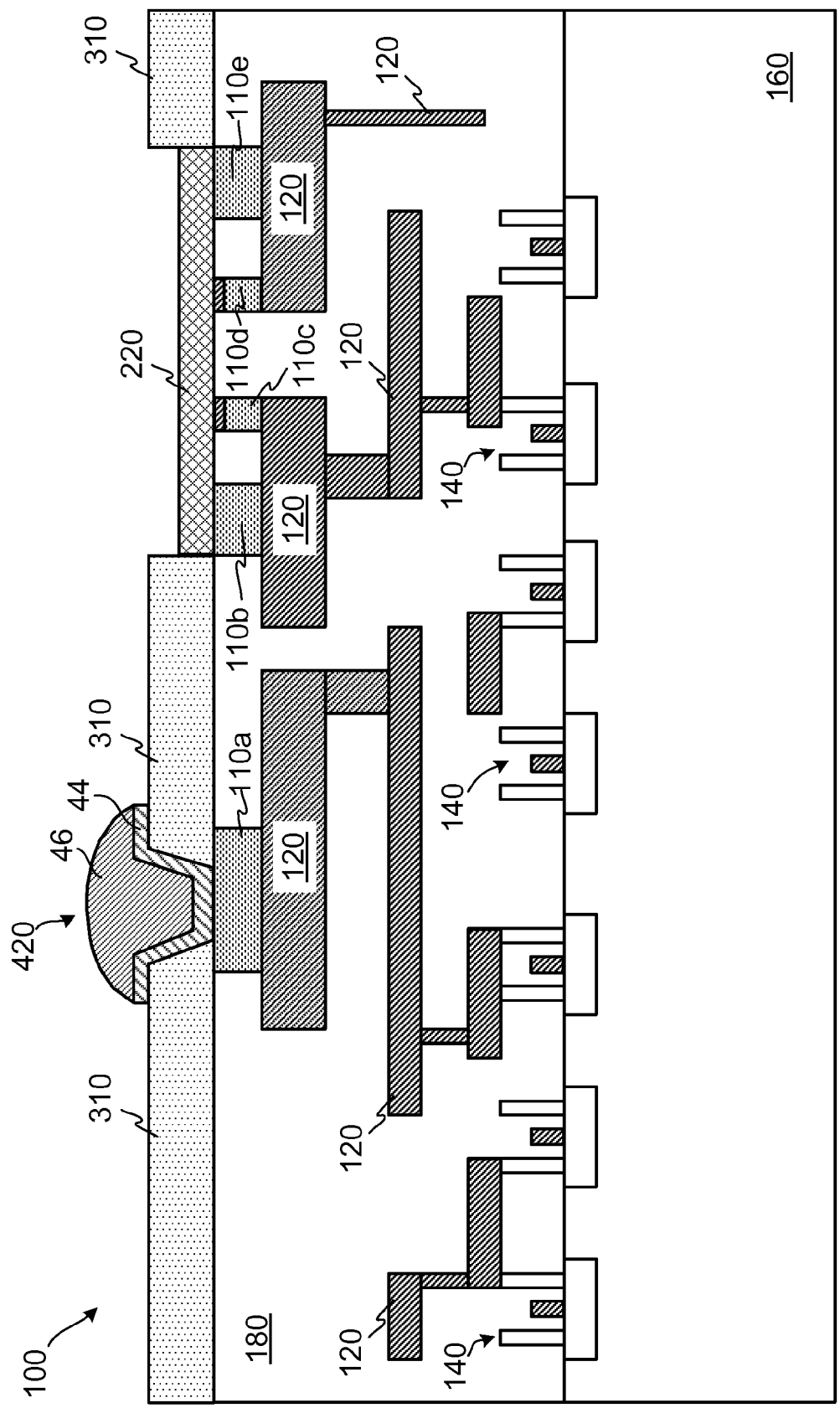
FIG. 4 is a cross-sectional view of the IC chip depicting forming a solder structure, according to an embodiment of the present disclosure.

Referring now to FIG. 4, a solder structure 420 may be formed in the opening 320 (FIG. 3). The solder structure 420 may include a solder bump 46 formed over a solder layer 44. The solder layer 44 may include TiN, TaN or any other suitable metal. Although the solder layer 44 is shown as a single layer, the solder layer 44 may include one or more layers. A CVD or physical vapor deposition (PVD) process may be used to form the solder layer 44 in the opening 320. The solder layer 44 may have a thickness ranging from approximately 100 nm to approximately 10,000 nm.

The solder bump 46 may include, for example, a micro bump, a general bump, a ball grid array (BGA) solder ball, or any other suitable solder structure made of a solder material such as Sn, Ag, Cu, or any combination thereof. Methods of forming the solder bump 46 over the solder layer 44 may include, for example, electroplating, chemical plating, or any other suitable technique. A patterned photoresist layer (not shown) may help to form the solder bump 46 in the opening 320 (FIG. 3). Although one solder bump 46 is shown in FIG. 4, it should be understood that there may be multiple solder bumps 46 in the IC chip 100 formed in a similar way. The solder bump 46 may have a substantially spherical shape with a diameter ranging from approximately 60 μm to approximately 150 μm.

Figure 5:
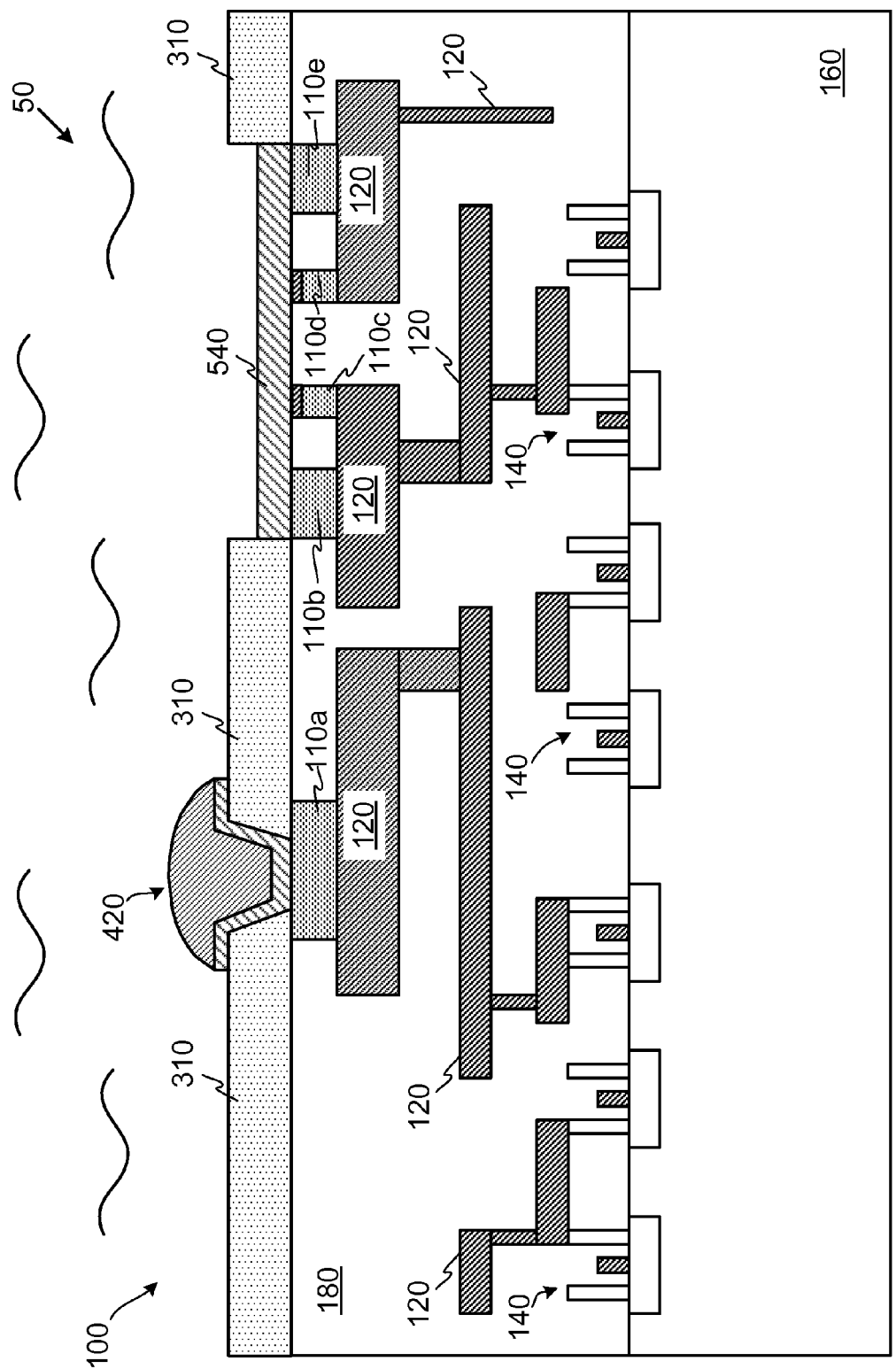
FIG. 5 is a cross-sectional view of the IC chip depicting oxidizing the silicon layer, according to an embodiment of the present disclosure.

Referring now to FIG. 5, the IC chip 100 may be exposed to an oxygen-containing environment 50 so that a silicon dioxide ($SiO_2$) layer 540 may be formed as a result of the catalytic oxidation of the silicon layer 220 (FIG. 4). By exposing the IC chip 100 to the oxygen-containing environment 50, at ambient conditions of pressure and temperature, oxidation of the silicon layer 220 (FIG. 4) may occur. During the oxidation process copper atoms from the oxidizing terminals (or top metal layers) 110b, 110e may diffuse to the silicon layer 220 and may catalyze the oxidation reaction. The catalytic oxidation of the silicon layer 220 (FIG. 4) may cause spontaneous growth of the silicon dioxide layer 540.

The silicon dioxide layer 540 may horizontally grow from an edge region towards a center region of the silicon layer 220 (FIG. 4) until substantially consuming or replacing the silicon layer 220 (FIG. 4). The oxidation of the silicon layer 220 (FIG. 4) may result from the segregation of copper atoms from the top metal layers 110b, 110e at an interface between the silicon layer 220 (FIG. 4) and the growing silicon dioxide layer 540 and of oxygen diffusion through the growing silicon dioxide layer 540. Typically, the rate at which the silicon dioxide layer 540 grows may depend on the amount of copper atoms present at the moving interface between the silicon layer 220 (FIG. 4) and the silicon dioxide layer 540.

In one embodiment, the growth rate of the silicon dioxide layer 540, at ambient conditions and without any additional power supply, may range from approximately 150 nm/month to approximately 1 μm/month. The catalytic effect of interfacial copper atoms from the top metal layers (or oxidizing terminals) 110b, 110e may facilitate the oxidation of the silicon layer 220 (FIG. 4) by changing the atomic bonding arrangement at the interface. It should be noted that a constant supply of oxygen may be required to carry out this reaction at ambient conditions. In one exemplary embodiment, the oxygen-containing fluid 50 surrounding the IC chip 100 may include ambient air.

As oxidation of the silicon layer 220 (FIG. 4) progresses, the growing silicon dioxide layer 540 may approach the sensing terminals 110c, 110d. Once above the sensing terminals 110c, 110d, the silicon dioxide layer 540 may function as an insulator layer substantially halting current flow through the sensing terminals 110c, 110d thereby creating an electrical open in the IC chip 100. As mentioned above, the connection between the top metal layers (sensing terminals) 110c, 110d and the silicon layer 220 (FIG. 4) may behave similarly to a fuse. By oxidizing the silicon layer 220 (FIG. 4) and forming the silicon dioxide layer 540, the fuse may be damaged creating an open circuit that may cause the IC chip 100 to become inoperable.

However, since only one fuse of the IC chip 100 may be damaged by the formation of the silicon dioxide layer 540, it may be possible to repair the IC chip 100 to regain operability. For instance, in one embodiment, the IC chip 100 may be repaired by entering a predetermined code that may allow the IC chip 100 to be reprogrammed to function again without the damaged fuse. Stated differently, by reprogramming the IC chip 100, the damaged region of the circuit (fuse) may be bypassed allowing the IC chip 100 to regain operability. It should be noted that only the designer or manufacturer of the IC chip 100 may have the ability to reprogram the circuit in order to bypass the damaged connection.

The time required to oxidize the silicon layer 220 (FIG. 4) may be proportional to the length of the silicon layer 220 (FIG. 4). Therefore, the length of the silicon layer 220 (FIG. 4) may define a time for the IC chip 100 to become inoperable and hence the shelf life or expiration date of the IC chip 100. Accordingly, the larger the length of the silicon layer 220 (FIG. 4) the longer the shelf life of the IC chip 100 may be since oxidation of the silicon layer 220 (FIG. 4), and hence the formation of the silicon dioxide layer 540, may take longer time to occur.

Therefore, the catalytic oxidation reaction between copper, oxygen and silicon at ambient conditions of pressure and temperature may be used to fabricate IC chips having a programmable shelf life. The ability to limit the life of IC chips may improve data security in different industry and government sectors. Since the oxidation reaction may take place at ambient conditions additional power supply may not be required which may potentially reduce manufacturing costs. Further, since only a fuse may be damaged by the formation of the silicon dioxide layer, the manufacturer may be able to reprogram the IC chip in order to bypass the damaged connection and reestablish functionality of the IC chip.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
   a first interconnect structure and a second interconnect structure each located within an interlevel dielectric (ILD);
   a first top metal layer and a second top metal layer disposed on and in direct electrical connection with the first interconnect;
   a third top metal layer and a fourth top metal layer disposed on and in direct electrical connection with the second interconnect;
   a silicon dioxide layer above the first, second, third and fourth top metal layers, the silicon dioxide layer is in direct contact with the first and fourth top metal layers; and
   a barrier layer separating the silicon dioxide layer from each of the second and third top metal layers,
   wherein a high resistance connection exist between the third top metal layer and the fourth top metal layer due to the presence of the silicon dioxide layer.

2. The structure of claim 1, wherein the structure is present in an oxygen-containing environment.

3. The structure of claim 1, wherein the high resistance connection between the third top metal layer and the fourth top metal layer damages an electrical connection between the third top metal layer and the fourth top metal layer.

4. The structure of claim 1, wherein the first top metal layer, the second top metal layer, the third top metal layer and the fourth top metal layer comprise a copper-rich material.

5. The structure of claim 1, wherein the silicon dioxide layer comprise an oxidized silicon layer, the oxidized silicon layer comprising catalysts copper atoms diffused from the first and fourth top metal layers.

6. The structure of claim 1, wherein a length of the silicon dioxide layer determines a time for the silicon dioxide layer to be substantially oxidized and damage the electrical connection between the third top metal layer and the fourth top metal layer.

7. The structure of claim 1, further comprising:
   a code to bypass the damaged electrical connection between the third top metal layer and the fourth top metal layer and reestablish a current flow in the structure.

8. The structure of claim 1, further comprising:
   a patterned protective layer above the ILD; and
   a solder structure located on the patterned protective layer.

9. A structure comprising:
   a plurality of top metal layers in an interlevel dielectric (ILD), the plurality of top metal layers are electrically connected to one or more interconnect structures of an IC chip;
   a barrier layer directly above two adjacent top metal layers, the two adjacent top metal layers being located between two outer top metal layers; and
   an oxidized silicon layer above the two adjacent top metal layers and the two outer top metal layers, the oxidized silicon layer being directly on top of the outer top metal layers,
   wherein the oxidized silicon layer is separated from the two adjacent top metal layers by the barrier layer,
   wherein the oxidized silicon layer, the two adjacent top metal layers and the barrier layer comprises a sensing circuit,
   wherein the oxidized silicon layer damages the sensing circuit and makes the IC chip inoperable.

10. The structure of claim 9, wherein the IC chip is present in an oxygen-containing environment.

11. The structure of claim 9, wherein the top metal layers comprise a copper-rich material.

12. The structure of claim 9, wherein the oxidized silicon layer comprises an insulating silicon oxide layer.

13. The structure of claim 9, wherein a high resistance connection exist between the two adjacent top metal layers and the oxidized silicon layer that halts current flow in the structure.

14. The structure of claim 13, wherein the high resistance connection between the two adjacent top metal layers and the oxidized silicon layer damages the sensing circuit, the damaged sensing circuit comprises an inoperable IC chip.

15. The structure of claim 9, wherein a length of the oxidized silicon layer determines a time for the oxidized silicon layer to be substantially oxidized and damage the IC chip.

16. The structure of claim 15, wherein the time for the oxidized silicon layer to be substantially oxidized comprises to a shelf life of the IC chip.

17. The structure of claim 10, wherein the oxygen-containing environment comprises an oxygen-containing fluid such as air.

18. The structure of claim 9, further comprising:
   a reprogramming code, wherein the reprogramming code allows the IC chip to function without the damaged sensing circuit and regain operability.

* * * * *